US006194962B1

(12) United States Patent
Chen (10) Patent No.: US 6,194,962 B1
(45) Date of Patent: Feb. 27, 2001

(54) ADAPTIVE OPERATIONAL AMPLIFIER OFFSET VOLTAGE TRIMMING SYSTEM

(75) Inventor: Marcellus R. Chen, Fremont, CA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 09/291,233

(22) Filed: Apr. 13, 1999

(51) Int. Cl.[7] ........................................... H03F 1/02
(52) U.S. Cl. .................................... 330/9; 330/253
(58) Field of Search ........................ 330/9, 253, 258

(56) References Cited

U.S. PATENT DOCUMENTS

| 4,766,394 | * | 8/1988 | Yukawa | 330/253 |
| 4,797,631 | * | 1/1989 | Hsu et al. | 330/253 |
| 4,887,048 | * | 12/1989 | Krenik et al. | 330/258 |
| 5,293,136 | * | 3/1994 | Ryat | 330/258 |
| 5,610,557 | | 3/1997 | Jett, Jr. | 330/261 |
| 5,734,297 | * | 3/1998 | Huijsing et al. | 330/253 |
| 5,764,101 | * | 6/1998 | Archer | 330/253 |

* cited by examiner

Primary Examiner—Robert Pascal
Assistant Examiner—Henry Choe
(74) Attorney, Agent, or Firm—Koppel & Jacobs (57) ABSTRACT

A system for adaptively trimming the input offset voltage of an op amp employing an input stage with complementary differential pairs provides accurate $VD_{os}$ trimming over the amplifier's entire common-mode input range, by providing an "adaptive" trim signal that varies with the current conducted by one of the complementary pairs. Switching circuitry insures that only one differential pair is active at a time, except in a transition region in which both pairs are partially conducting. The use of an adaptive trim signal enables $V_{os}$ to be kept low over the full range of common-mode input voltages, including in the amplifier's transition region.

16 Claims, 8 Drawing Sheets

ADAPTIVE OPERATIONAL AMPLIFIER OFFSET VOLTAGE TRIMMING SYSTEM

BACKGROUND OF THE INVENTION

1. Field of the Invention

This invention relates to the field of operational amplifier offset voltage ($V_{os}$) trimming techniques, and particularly to $V_{os}$ trimming for op amps with rail-to-rail input stages.

2. Description of the Related Art

"Input offset voltage" ($V_{os}$) is a parameter associated with operational amplifiers (op amps), defined as the output voltage produced by the op amp when its differential input voltage is zero. An untrimmed $V_{os}$ can be on the order of millivolts, which appears as an error in the amplifier's output. When a highly accurate op amp is needed, a trimming method is typically used to make $V_{os}$ as small as possible; such methods include laser trimming a resistor during assembly, and applying a fixed "trim current" to a particular circuit node.

Rail-to-rail op amps, i.e., op amps which function for input signals that vary up to the amplifier's positive and negative supply voltages, pose an especially troublesome trimming problem. This is because such op amps typically employ complementary differential pairs, instead of the single differential pair found in conventional amplifiers. Each of the two differential pairs has a respective offset voltage, with the degree to which the amplifier's output is affected by the offset voltages being dependent on which of the pairs is conducting at any given time.

Figure 1:
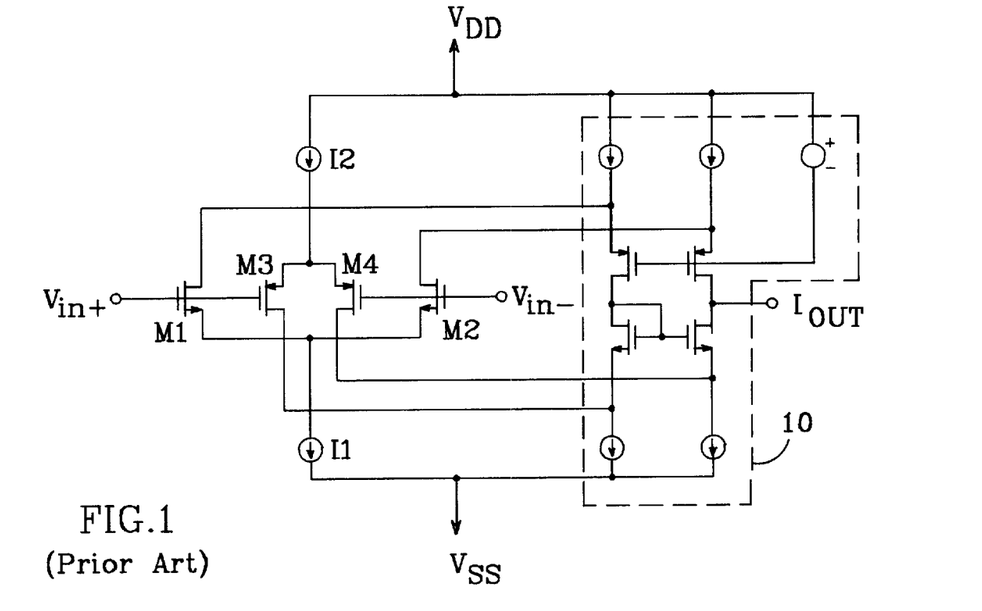
FIG. 1 is a schematic of a prior art rail-to-rail op amp.

A conventional rail-to-rail op amp is shown in FIG. 1. The gates of a first differential pair of transistors M1 and M2 are connected across the amplifier's differential input terminals $V_{in+}$ and $V_{in-}$; M1 and M2 are biased with a current source I1 connected between their respective sources and a negative supply voltage $V_{SS}$. A second pair of transistors M3 and M4 are also connected across $V_{in+}$ and $V_{in-}$, and are biased with a current source I2 connected between their respective sources and positive supply voltage $V_{DD}$. Each pair produces a respective differential output current between its two drain terminals. All four drain terminals are connected to an output stage 10, which converts the differential output currents to a single ended output current $I_{OUT}$.

In the circuit shown in FIG. 1, M1 and M2 are n-channel FETs having their sources referenced to $V_{SS}$, and M3 and M4 are p-channel FETs having their sources referenced to $V_{SS}$, enabling the amplifier to handle rail-to-rail input voltages. Both pairs of transistors are active at the same time, except when the input common-mode voltage ($V_{cm}$) is close to either rail. One of the pairs turns off when this occurs, because its transistors' gate-to-source voltages ($V_{gs}$) become less than their threshold voltages ($V_T$). Thus, only M1 and M2 are active if $V_{cm}$ is above about $V_{DD}-1$ volt, and only M3 and M4 are active if $V_{cm}$ is below about $V_{SS}+1$ volt.

As noted above, both differential pairs contribute to the amplifier's offset voltage. $V_{os}$ is fairly constant over that portion of the common-mode input range for which both pairs are active, and this $V_{os}$ value can be reduced by trimming. Unfortunately, $V_{os}$ will change when one or the other of the pairs stop conducting near the supply rail. When this occurs, the trim adjustment made to correct $V_{os}$ when both pairs are active is now incorrect, and $V_{os}$ will increase.

Figure 2:
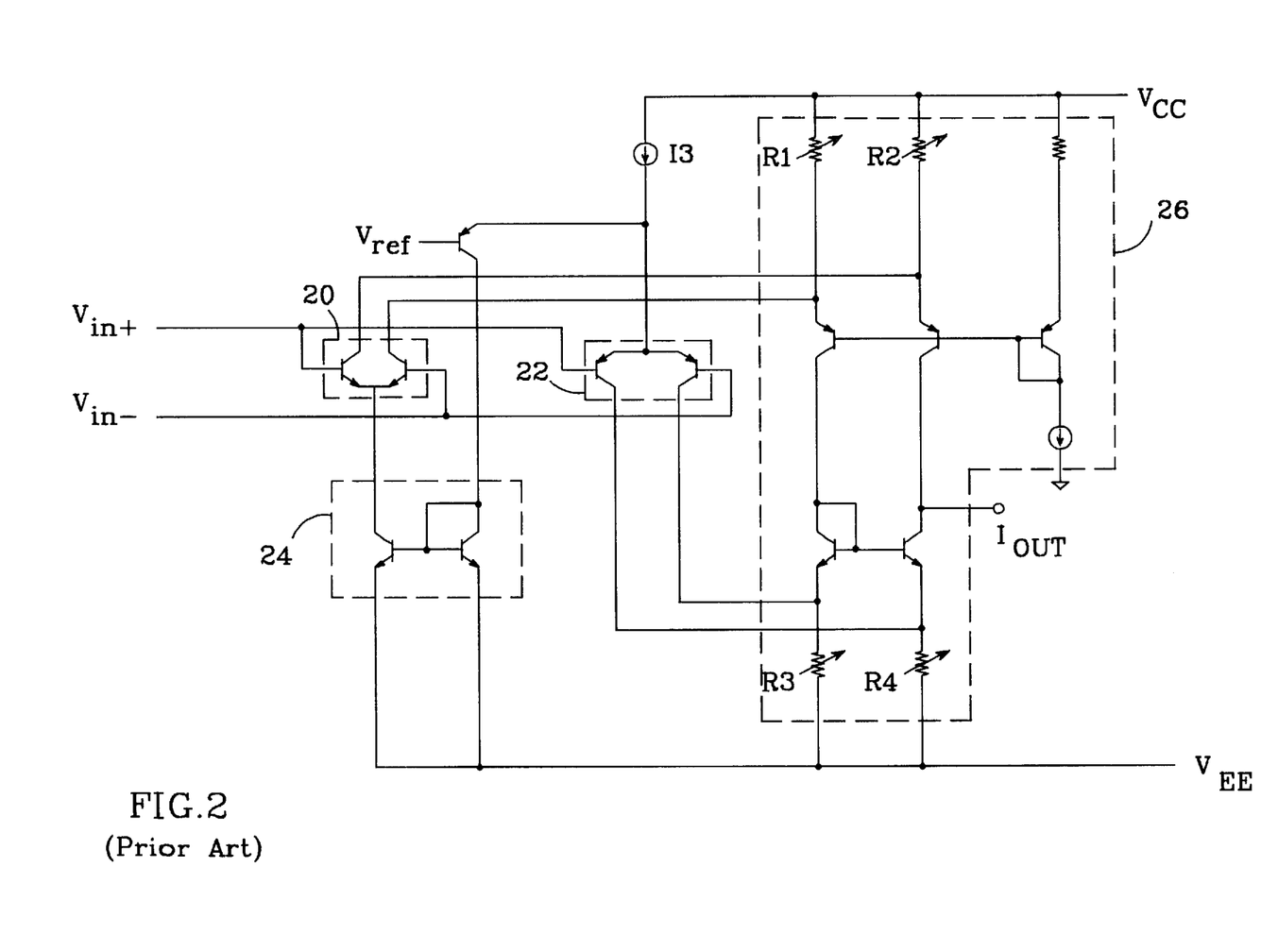
FIG. 2 is a schematic of a prior art rail-to-rail op amp which enables $V_{os}$ to be trimmed.

Another known rail-to-rail op amp is disclosed in U.S. Pat. No. 5,610,557 to Jett, Jr., and is shown in FIG. 2. Two complementary differential pairs 20 and 22 are connected across the amplifier's differential input terminals $V_{in+}$ and $V_{in-}$. A constant current source I3 biases differential pair 22, and a constant current source 24 biases differential pair 20. A transistor $Q_{steer}$ is connected between I3 and current source 24, and receives a reference voltage $V_{ref}$ at its base. When $Q_{steer}$ is not conducting, pair 22 receives bias current I3 and is active. When $Q_{steer}$ begins to conduct, at a common-mode input voltage established by the value of $V_{ref}$, I3 is diverted to current source 24, disabling pair 22 and activating pair 20. Thus, only one pair is active at a time over most of the amplifier's common-mode input range.

The collector currents of the two pairs are connected to an output stage 26, which converts the two differential currents to a single-ended output current $I_{out}$. A $V_{os}$ trimming capability is provided by four variable resistors R1–R4 in output stage 26. R1 and R2 are adjusted to trim $V_{os}$ when pair 20 is active, and R3 and R4 trim $V_{os}$ when pair 22 is active. There are several drawbacks to this trimming approach, however. The trim currents provided by R1–R4 are always present regardless of which differential pair is active, and while a pair's respective trim currents may be appropriate when its pair is active, they are unlikely to be ideal when the other pair is active. Furthermore, R1/R2 and R3/R4 are adjusted when their respective pairs are fully conducting. However, there is a transition region over which one pair stops conducting while the other pair starts conducting. Because the fixed trim currents provided by R1–R4 are adjusted to correct $V_{os}$ for common-mode voltages on either side of the transition region, the amplifier's $V_{os}$—and the inaccuracy of $I_{out}$—increases for common-mode input voltages that fall within the transition region.

SUMMARY OF THE INVENTION

A system for adaptively trimming the input offset voltage of an op amp is presented which overcomes the problems noted above. The invention provides accurate $V_{os}$ trimming over an amplifier's entire common-mode input range, by providing an "adaptive" trim signal that varies with the current conducted by the amplifier's input stage.

The system is used with an op amp having complementary differential pairs in its input stage, which are typically provided to give the op amp a rail-to-rail common-mode input voltage range. Switching circuitry insures that only one pair is active at a time, except in a transition region in which both pairs are partially conducting. The op amp's output stage includes a trim input by which the amplifier's output can be adjusted to reduce $V_{os}$. Trim circuitry is employed which tracks the current in at least one of the pairs, and generates an "adaptive" trim signal which varies with the tracked current. This adaptiveness enables $V_{os}$ to be kept low over the full range of common-mode input voltages, including in the amplifier's transition region.

In a preferred embodiment, the switching circuitry controls which pair is active by forcing the first pair to turn off while providing bias current to activate the second pair. The trim circuitry preferably provides two outputs to the output stage's trim input: one trim signal which is constant with respect to common-mode input voltage, and an adaptive trim signal which varies with the bias current fed to the second pair. The generation of an adaptive trim signal enables $V_{os}$ to be reduced even for common-mode input voltages in the transition region.

Further features and advantages of the invention will be apparent to those skilled in the art from the following detailed description, taken together with the accompanying drawings.

DETAILED DESCRIPTION OF THE INVENTION

Figure 3:
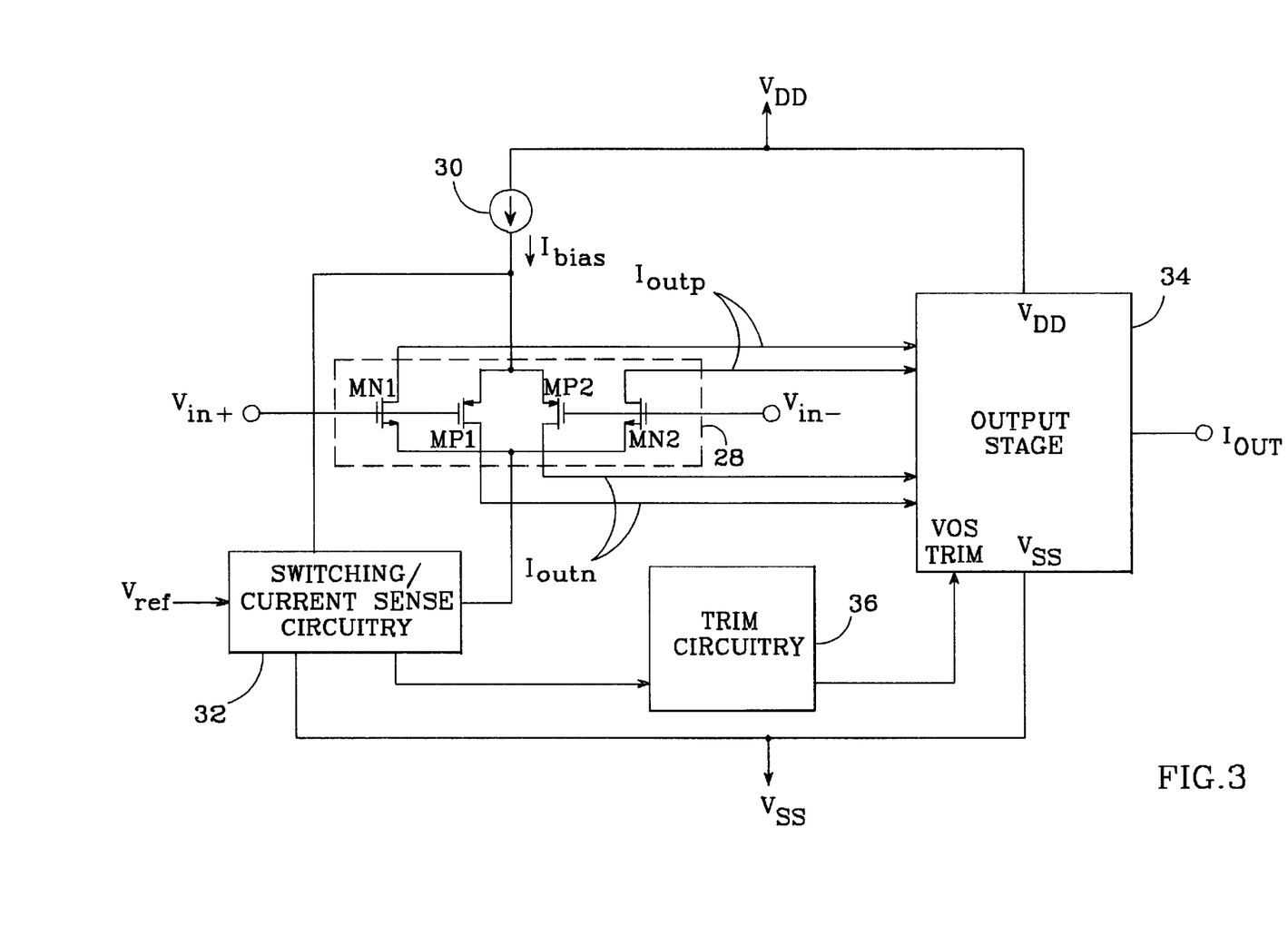
FIG. 3 is a block/schematic diagram of a rail-to-rail op amp with adaptive offset voltage trimming per the present invention.

An op amp with adaptive offset voltage trimming per the present invention is shown in FIG. 3. The amplifier has an input stage 28 which includes a first differential pair MP1 and MP2 (referred to herein as "MP1/MP2") and a complementary second differential pair MN1 and MN2 ("MN1/MN2") connected across the amplifier's differential input terminals $V_{in+}$ and $V_{in-}$. In the exemplary circuit shown in FIG. 3, MP1/MP2 and MN1/MN2 are p-channel and n-channel FETs, respectively.

MP1/MP2 are biased with respect to the amplifier's positive supply voltage $V_{DD}$, and MN1/MN2 are biased with respect to the amplifier's negative supply voltage $V_{SS}$, providing a common-mode input voltage range that includes $V_{DD}$ and $V_{SS}$—i.e., a "rail-to-rail" common-mode input voltage range. A current source 30 is connected between $V_{DD}$ and the source terminals of MP1/MP2 and provides a bias current $I_{bias}$ to the pair. MN1/MN2 are biased via a "switching/current sense" circuit 32 connected between the source terminals of MN1/MN2 and $V_{SS}$; the operation of circuit 32 is discussed in detail below.

The amplifier is arranged so that as its common-mode input voltage ($V_{cm}$) approaches a value $V_{switch}$, MP1/MP2 begin to turn off, and switching/current sense circuit 32 begins providing the bias current needed to make MN1/MN2 active. This arrangement insures that only one differential pair is active over most of the common-mode input voltage range. Differential output currents $I_{outp}$ and $I_{outn}$ are produced at the drains of pair transistors MP1/MP2 and MN1/MN2, respectively, and are connected to an output stage 34. Output stage 34 converts the two differential output currents $I_{outp}$ and $I_{outn}$ to a single-ended output $I_{out}$, which is the amplifier's output.

Output stage 34 is also arranged to receive a trim signal at a VOS TRIM input, and to vary output $I_{out}$ in accordance with the value of the trim signal received. The VOS TRIM input is provided to enable the amplifier's input offset voltage $V_{os}$ to be reduced and brought closer to its ideal value of zero. Trim circuitry 36 (described below) is employed to provide an appropriate trim signal to output stage 34.

As noted above, the op amp is arranged so that only one differential pair is active over most of the common-mode input voltage range. There is, however, a range of common-mode voltages—referred to herein as the "transition region"—in which both pairs are at least partially conducting; this region is centered around $V_{switch}$. Conventional trimming techniques fail in the transition region, because when both differential pairs are conducting, they both contribute to the amplifier's $V_{os}$. A conventional fixed trim technique might reduce $V_{os}$ when one pair or the other is active, but incorrectly trims $V_{os}$ when both pairs are on and thereby degrades the amplifier's accuracy in this region.

The invention solves this problem with trim circuitry 36, which is arranged to produce a trim signal that varies with the current conducted by at least one of the complementary pairs, preferably the MN1/MN2 current. Trim circuitry 36 is connected to switching/current sense circuit 32, by which it tracks the current conducted by MN1/MN2 and produces an "adaptive" trim signal output that varies with the tracked current; the adaptive trim signal is connected to the VOS TRIM input of output stage 34. This adaptive trim signal provides several benefits. Because its magnitude varies with the MN1/MN2 current, the adaptive trim signal first appears as $V_{cm}$ enters the transition region, and increases in magnitude with the MN1/MN2 current. A properly proportioned adaptive trim signal thus reduces the amplifier's $V_{os}$ in the transition region by specifically countering the contribution made to $V_{os}$ by the MN1/MN2 pair.

Furthermore, because the adaptive trim signal is generated only when MN1/MN2 are active, it is therefore not active when MP1/MP2 are the active pair. As a result, the adaptive trim signal will not adversely affect the amplifier's $V_{os}$ when MP1/MP2 are active.

Note that trim circuitry 36 can also be implemented to produce a trim signal that varies with the MP1/MP2 current instead of the MN1/MN2 current, or which varies with the currents in both pairs. Having the adaptive trim signal vary with the MN1/MN2 current is preferred, however, because it enables a low $V_{os}$ to be provided over the entire common-mode input voltage range without requiring an excessive amount of components within trim circuitry 36. These alternative implementations are discussed in more detail below.

The invention is used with op amps which include complementary differential pairs in their input stages. This op amp configuration is typically used to provide a rail-to-rail common-mode input range. The invention is not limited to use with rail-to-rail op amps, however. The adaptive trimming system is advantageously employed as long as an op amp includes complementary differential pairs in its input stage, each of which is active over a different portion of the common-mode input range.

Figure 4:
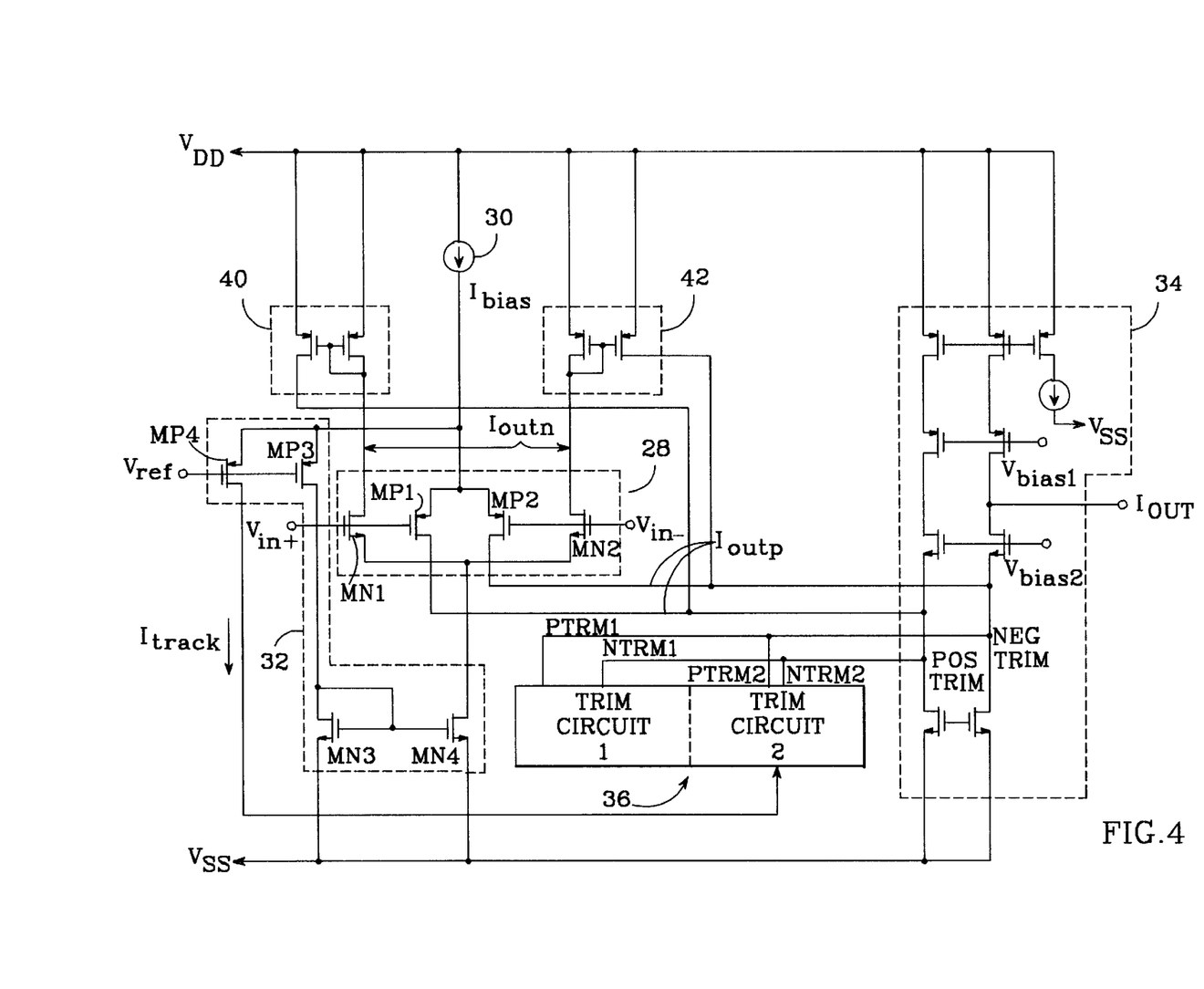
FIG. 4 is a block/schematic diagram of a preferred embodiment of the op amp of FIG. 3.

A preferred embodiment of the present invention is shown in FIG. 4. MP1/MP2 and MN1/MN2 remain as the amplifier's complementary differential pairs, with MP1/MP2 biased with current source 30. MP1/MP2's differential output current $I_{outp}$ is connected to output stage 34, which is implemented as a folded cascode stage into which $I_{outp}$ is summed. MN1/MN2's differential output current $I_{outn}$ is mirrored by current mirrors 40 and 42 and summed into the folded cascode stage. Output stage 34 converts the summed differential output currents $I_{outp}$ and $I_{outn}$ to single-ended amplifier output $I_{out}$.

Switching/current sense circuit 32 is preferably implemented with a pair of transistors MP3 and MP4, which have their gates commonly connected to a reference voltage $V_{ref}$ and their sources commonly connected to the sources of MP1/MP2. Circuit 32 also includes a pair of transistors MN3 and MN4 connected in a current mirror configuration, which mirrors MP3's drain current to MN1/MN2's commonly connected sources.

Circuit 32 operates to make one differential pair or the other active in the following manner. The gate voltage of MP3 is fixed by $V_{ref}$. As the common-mode input voltage $V_{cm}$ increases from $V_{SS}$ toward $V_{DD}$, the MP1/MP2 source voltages will also increase, as will the source voltage of MP3. For at least a portion of the common-mode input range, MP3's gate-to-source voltage ($V_{gs3}$) will be less than its threshold voltage ($V_{T3}$) and MP3 will be off. However, as $V_{cm}$ moves towards $V_{DD}$, $V_{gs3}$ will eventually exceed $V_{T3}$, and MP3 will turn on. Once MP3 begins conducting, its source voltage becomes fixed, which also fixes the MP1/MP2 source voltages. However, $V_{cm}$ can continue to increase, and as it does, MP1/MP2's gate-to-source voltages ($V_{gs1}$, $V_{gs2}$) will decrease. When $V_{gs1}$ and $V_{gs2}$ become smaller than their respective transistors' threshold voltages, MP1 and MP2 turn off.

The drain of MP3 is connected to the MN3/MN4 current mirror. Thus, when MP3 begins conducting, its drain current is mirrored (and ratioed if desired) to MN1 and MN2, providing bias current for MN1/MN2 and thereby making them the active pair.

The $V_{cm}$ at which MP1/MP2 turn off and MN1/MN2 turn on is referred to herein as $V_{switch}$, which is set by the value of $V_{ref}$ and $V_{gs3}$. $V_{ref}$ is preferably selected such that $V_{gs3}$ will be less than $V_{T3}$ (and thus MP3, MN1, and MN2 will be off) over most of the common-mode input voltage range. This is preferred because only one differential pair is active over most of the common-mode input voltage range, reducing the range over which the $V_{os}$ contribution made by the second pair must be considered.

There is a range of common-mode input voltages over which MP1/MP2 are turning off and MN1/MN2 are turning on; this is referred to as the "transition region". It is in this region that both differential pairs contribute to $V_{os}$—a condition greatly improved via use of the invention (as described below).

Trim circuitry 36 is preferably implemented with two circuits TRIM CIRCUIT 1 and TRIM CIRCUIT 2. TRIM CIRCUIT 1 generates trim currents POS TRIM 1 and NEG TRIM 1, and TRIM CIRCUIT 2 generates trim currents POS TRIM 2 and NEG TRIM 2. The VOS TRIM input of output stage 34 includes two circuit nodes identified as POS TRIM and NEG TRIM; POS TRIM 1 and POS TRIM 2 are connected to the POS TRIM node, and NEG TRIM 1 and NEG TRIM 2 are connected to a NEG TRIM node. A current applied to the POS TRIM node counters a negative value of $V_{os}$, while a trim current applied to NEG TRIM counters a positive $V_{os}$.

The trim currents POS TRIM 2 and NEG TRIM 2 generated by TRIM CIRCUIT 2 are adaptive; i.e., they are arranged to vary with the current in MN1/MN2. The current in MN1/MN2 is preferably tracked with transistor MP4 in switching/current sense circuit 32. The gate and source of MP4 are connected in common with the same terminals of MP3, so that MP4 begins conducting at approximately the same $V_{cm}$ as MP3. Since it is MP3's drain current that creates MN1/MN2's bias current, MP4's nearly equal drain current (identified as "$I_{track}$") will vary with the MN1/MN2 current and can thus be used to track the current conducted by MN1/MN2. $I_{track}$ is fed to TRIM CIRCUIT 2 and used to vary the values of POS TRIM 2 and NEG TRIM 2.

As noted above, the adaptive trimming system is not limited to use with rail-to-rail op amps. Nor is the invention limited to the preferred embodiment of FIG. 4. Essential to the invention are an op amp employing complementary differential pairs in the input stage, a switching means which makes either one differential pair or the other active depending on the common-mode input voltage, an output stage which provides a means by which the amplifier output can be trimmed, and an adaptive trim circuit which generates a trim signal compatible with the output stage's trim means that varies with the current in at least one of the differential pairs. Many possible circuit configurations could be used to realize an op amp per the present invention. For example, output stage 34 need not be a folded cascode stage; it need only be able to sum the two differential output currents into a combined amplifier output and provide one or more nodes by which the output can be trimmed. As another example, MP4 need not be used to track the MN1/MN2 current; one possible alternative is to connect a transistor in common with the gate and source of MN4, which would then produce a drain current that varied with the current in MN1/MN2.

Nor is the present invention limited to the FET implementation shown. The circuits and methods described herein are equally adaptable to other technologies, including CMOS, bipolar and BiCMOS.

Figure 5:
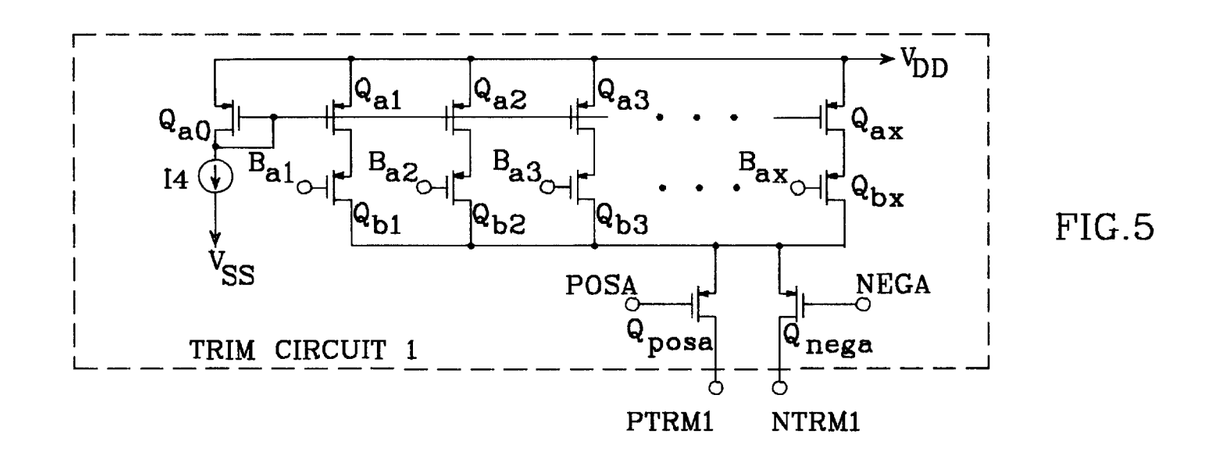
FIG. 5 is a schematic diagram of a trim circuit which generates a fixed trim signal for use with the op amp of FIG. 3.

FIG. 5 depicts a schematic diagram of a preferred implementation of the TRIM CIRCUIT 1 portion of trim circuitry 36. Transistors $Q_{a1}, Q_{a2}, Q_{a3}, \ldots, Q_{ax}$ are x binary weighted current source transistors, each of which is mirrored off a diode-connected transistor $Q_{a0}$ that conducts a current set by a current source I4. Each current source transistor $Q_{a1}$, $Q_{a2}, \ldots, Q_{ax}$ is connected to a respective current switch transistor $Q_{b1}, Q_{b2}, \ldots, Q_{bx}$ each of which is controlled by a respective control signal $B_{a1}, B_{a2}, \ldots, B_{ax}$. The outputs of the current switches are summed by current switch transistors $Q_{posa}$ and $Q_{nega}$, which are controlled by control signals POS A and NEG A, respectively, and which produce the trim circuit's POS TRIM 1 and NEG TRIM 1 outputs. POS A and NEG A are connected to $V_{DD}$ and $V_{SS}$ (one control input to each supply voltage) as necessary to direct the summed currents to either the POS TRIM 1 or NEG TRIM 1 output. A trim current is present on only one of the two outputs: if $V_{os}$ is negative, the summed currents are directed to POS TRIM 1; if $V_{os}$ is positive, the summed currents are directed to NEG TRIM 1.

$B_{a1}, B_{a2}, \ldots, B_{ax}$ could represent, for example, the bits of a digital control word which is varied as needed to generate a desired trim current. Once an acceptable bit pattern is identified, $B_{a1}, B_{a2}, \ldots, B_{ax}$ may be fixed to permanently present the identified pattern to the current switch transistors. Methods of permanently encoding a bit pattern—such as polysilicon or metal fuses or zener zapping, for example—are well-known to those familiar with analog circuit trimming techniques.

Figure 6:
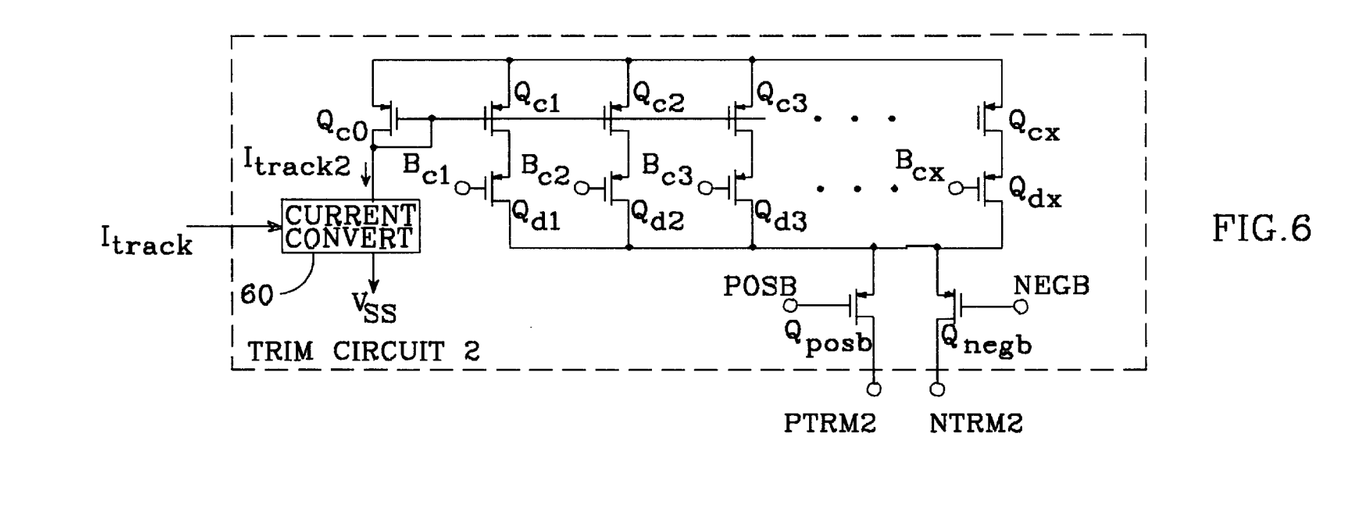
FIG. 6 is a schematic diagram of a trim circuit which generates an adaptive trim signal for use with the op amp of FIG. 3.

FIG. 6 depicts a schematic diagram of a preferred implementation of the TRIM CIRCUIT 2 portion of trim circuitry 36, which is very similar to that of TRIM CIRCUIT 1. Transistors $Q_{c1}, Q_{c2}, \ldots, Q_{cx}$ are binary weighted current source transistors, each of which is mirrored off a diode-connected transistor $Q_{c0}$ and is connected to a respective current switch transistor $Q_{d1}, Q_{d2}, \ldots, Q_{dx}$ controlled by respective control signals $B_{c1}, B_{c2}, \ldots, B_{cx}$. The outputs of the current switches are summed by current switch transistors $Q_{posb}$ and $Q_{negb}$, which are controlled by control signals POS B and NEG B, respectively, and which produce the trim circuit's POS TRIM 2 and NEG TRIM 2 outputs. TRIM CIRCUIT 2 differs from TRIM CIRCUIT 1 in that the current in its diode-connected transistor $Q_{c0}$ is set by a "current convert" circuit 60. Circuit 60 receives the $I_{track}$ current representative of the current in MN1/MN2 as an input, and produces an output $I_{track2}$ that varies with $I_{track}$. $I_{track2}$ establishes the current mirrored by current source transistors $Q_{c1}, Q_{c2}, \ldots, Q_{cx}$, so that the trim circuit's output current POS TRIM 2 or NEG TRIM 2 is made to vary in accordance with the value of $I_{track}$. As with POS TRIM 1 and NEG TRIM 1, only one of TRIM CIRCUIT 2's two outputs carries a current at any one time, as needed to counter the amplifier's $V_{os}$.

TRIM CIRCUIT 2 is designed to produce a trim signal that varies with the current in MN1/MN2. However, a maximum value for its trim signal can be established by permanently encoded a desired bit pattern at control inputs $B_{c1}, B_{c2}, \ldots, B_{cx}$ as discussed above.

Figure 7:
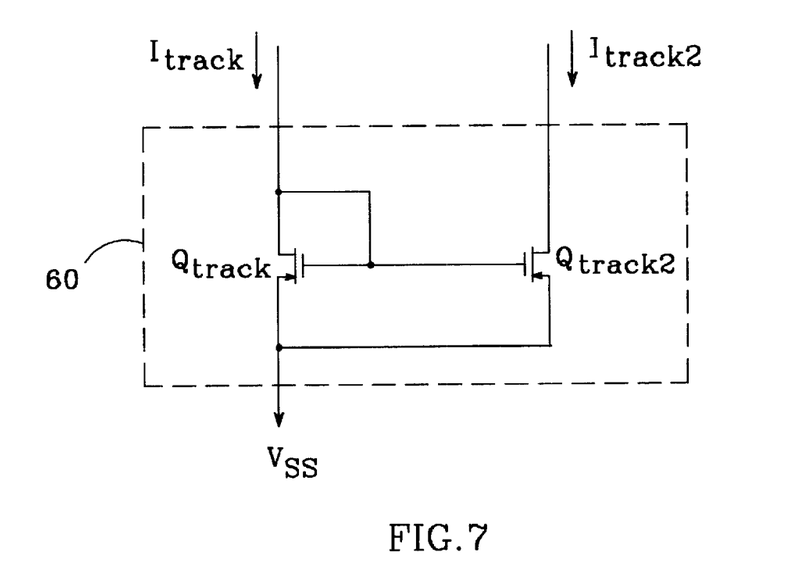
FIG. 7 is a schematic diagram of a current conversion circuit suitable for use with the trim circuit of FIG. 6.

One possible embodiment of current convert circuit 60 is shown in FIG. 7, which depicts a simple current mirror. $I_{track}$ establishes the current in a diode-connected transistor $Q_{track}$, which is mirrored by a transistor $Q_{track2}$ to produce $I_{track2}$. This arrangement causes current source transistors $Q_{c1}, Q_{c2}, \ldots, Q_{cx}$ to be on only when MN1/MN2 are on. More elaborate current converting circuitry than that shown in FIG. 7 might be employed, to correct for dependencies on temperature or supply voltage, for example. Note also that the trim circuits shown in FIGS. 5 and 6 could be realized via many different means; it is only necessary that TRIM CIRCUIT 1 be capable of providing an trimmable trim signal and that TRIM CIRCUIT 2 be capable of generating a trim signal which tracks the current in one of the amplifier's differential pairs.

Trim current values which will best reduce $V_{os}$ over the full range of common-mode input voltages are determined in the following manner. $V_{os}$ should first be measured with only one of the pairs active. In this example, the offset voltage with MP1/MP2 active is measured first; this offset voltage is referred to as $V_{os}(P)$. $V_{os}(P)$, which can be of positive or negative polarity, is given by:

$$V_{os}(P)=V_{os}(MP1/MP2)+V_{os}(\text{referred})$$

where $V_{os}(MP1/MP2)$ is the offset voltage contribution from MP1 and MP2 and $V_{os}(\text{referred})$ is the input referred offset contributions from the transistors in folded cascode stage 34 and any subsequent stages. $V_{os}(P)$ can be adjusted to 0 volts or near 0 volts by injecting a trim current Itrim(P) into node NEG TRIM or POS TRIM, depending on the polarity of $V_{os}(P)$. When injected into node POS TRIM, TRIM CIRCUIT 1's output signal POS TRIM 1=Itrim(P); when injected into node NEG TRIM, NEG TRIM 1=Itrim(P). Itrim(P) is given by:

$$\text{Itrim}(P)=V_{os}(P)\times Gm(MP1, MP2)$$

where Gm(MP1, MP2) is the transconductance of transistors MP1 and MP2. TRIM CIRCUIT 1 is used to realize Itrim(P). Itrim(P) is preferably produced over the entire common-mode input voltage range, regardless of which differential pair is active.

Once a value has been determined for Itrim(P), $V_{os}$ is measured with only MN1/MN2 active; this offset voltage is referred to as $V_{os}(N)$ and is given by:

$$V_{os}(N)=V_{os}(MN1, MN2)+V_{os}(\text{referred})$$

where $V_{os}(MN1, MN2)$ is the offset contribution from MN1 and MN2, and $V_{os}(\text{referred})$ is the input referred offset contributions from current mirrors 40 and 42 and from MP1/MP2. The MP1/MP2 contribution is contained within $V_{os}(N)$ because, though MP1/MP2 are not active and thereby not contributing any offset, Itrim(P) is active. A portion of Itrim(P) trims $V_{os}(MP1/MP2)$, and this portion of Itrim(P) contributes $V_{os}(MP1/MP2)$ to $V_{os}(N)$.

$V_{os}(N)$ is adjusted to near 0 volts by injecting a current Itrim(N) into node NEG TRIM or POS TRIM, depending on the polarity of $V_{os}(N)$. When injected into node POS TRIM, TRIM CIRCUIT 2's output signal POS TRIM 2=Itrim(N); when injected into node NEG TRIM, NEG TRIM 2=Itrim (P). When MN1/MN2 are fully active, Itrim(N) is given by:

$$\text{Itrim}(N)=V_{os}(N)\times Gm(MN1, MN2)$$

where Gm(MN1, MN2) is the transconductance of transistors MN1 and MN2. Note that in the transition region, with the MN1/MN2 current being mirrored to produce Itrim(N), Itrim(N) increases linearly with the MN1/MN2 current; i.e., Itrim(N) is linearly dependent on the MN1/MN2 current in the transition region.

As noted above, Itrim(P) and Itrim(N) are preferably realized with similar circuitry, except that Itrim(P) is always on, while Itrim(N) is not. As explained above, Itrim(N) tracks the current in MN1/MN2, making Itrim(N) adaptive and dynamically adjusted to the amount of current in MN1/MN2.

Only Itrim(N) is adaptive in the preferred embodiment of the invention, though Itrim(P) could also be made adaptive. An adaptive Itrim(P) would vary with the current in MP1/MP2, and would thus be off when MP1/MP2 were off. However, even when MP1/MP2 are off, the transistors of folded cascode 34 continue to contribute to the amplifier's $V_{os}$. The preferred embodiment's continually active Itrim(P) countered these contributions, but with an adaptive Itrim(P), this duty would fall to Itrim(N) when MP1/MP2 are off. Itrim(N) must therefore be larger than is needed in the preferred embodiment—large enough to trim the $V_{os}$ contributed by MN1/MN2, the transistors of folded cascode 34, and the transistors of current mirrors 40 and 42. To generate a larger Itrim(N) while maintaining a high level of trim resolution, the number of current sources in the trim circuit would need to be increased. More current source transistors would require more die space, which is typically undesirable. Therefore, though the invention encompasses an implementation in which both Itrim(N) and Itrim(P) are adaptive, it is not the preferred approach. An implementation in which Itrim(P) is adaptive, while Itrim(N) is constant with respect to $V_{cm}$ is also feasible (requiring TRIM CIRCUIT 2 to track the current in MP1/MP2 instead of MN1/MN2), though making Itrim(N) adaptive is preferred because the MN1/MN2 current can be easily tracked using a single transistor (MP4).

Figure 8A:
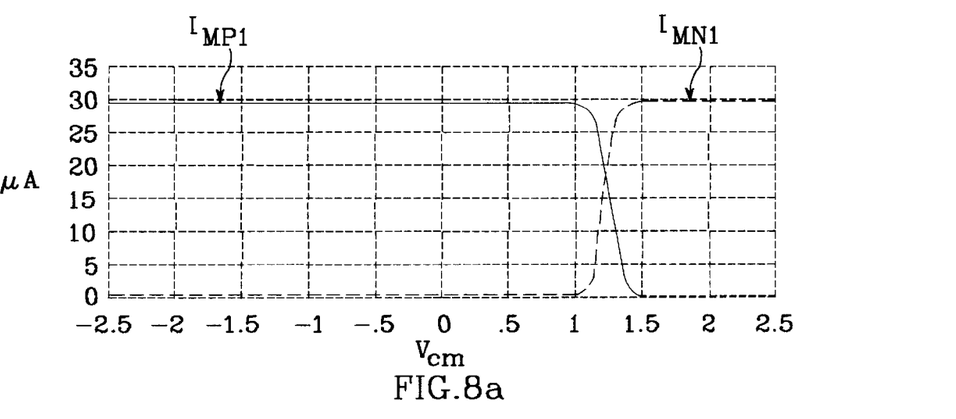
FIG. 8a is a graph depicting a simulated plot of the drain currents of two pair transistors vs. common-mode input voltage for an op amp per the present invention.
Figure 8B:
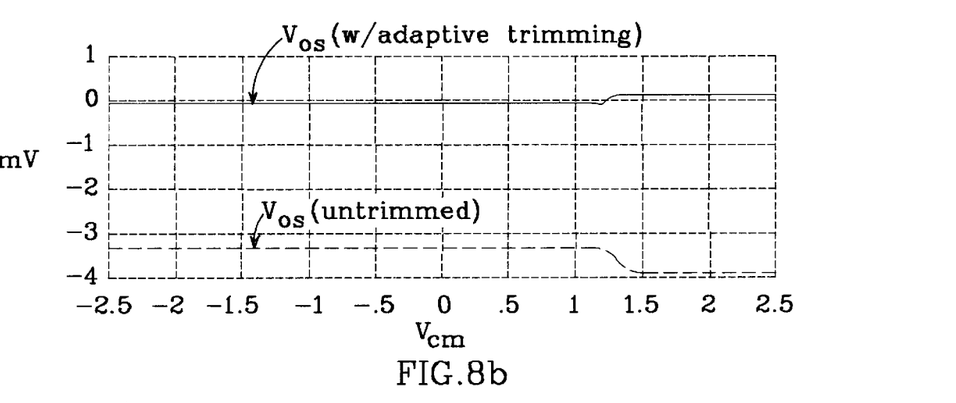
FIG. 8b is a graph depicting a simulated plot of offset voltage vs. common-mode input voltage for an op amp per the present invention.
Figure 8C:
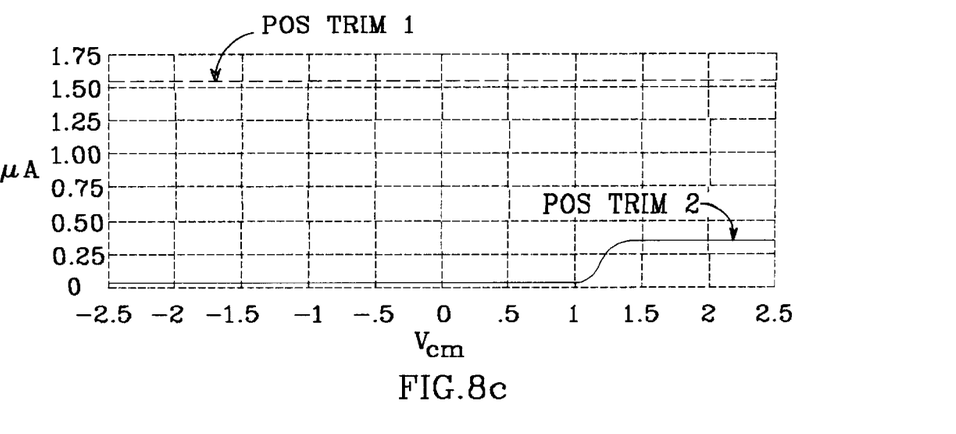
FIG. 8c is a graph depicting a simulated plot of trim currents vs. common-mode input voltage for an op amp per the present invention.

The operation of a rail-to-rail op amp per FIG. 4 has been simulated, with $V_{DD}$ and $V_{SS}$ set to +2.5 volts and −2.5 volts, respectively; the results are shown in the graphs of FIGS. 8a, 8b and 8c. FIG. 8a illustrates the current in one transistor of each pair as $V_{cm}$ is swept from −2.5 volts to +2.5 volts. The solid line is the current in MP1 ($I_{MP1}$) and the dashed line is the current in MN1 ($I_{MN1}$); the currents in MP2 and MN2 will be about equal to those in MP1 and MN1, respectively. Vswitch has been established at about 1.2 volts, with the amplifier's transition region—in which MP1/MP2 are turning off and MN1/MN2 are turning on—found between about 0.9 and 1.4 volts $V_{cm}$.

FIG. 8b simulates the amplifier's $V_{os}$, both without trimming (dashed line) and with adaptive trimming per the present invention (solid line). Without trimming, $V_{os}$ is about −3.36 mv when MP1/MP2 are active (below the transition region), and about −3.91 mv when MN1/MN2 are active (above the transition region).

FIG. 8c simulates the trim currents generated by the trim circuitry. As $V_{os}$ is negative over the entire common-mode input voltage range, the trim currents produced by TRIM CIRCUIT 1 and TRIM CIRCUIT 2 are directed to their POS TRIM 1 and POS TRIM 2 outputs, respectively, and both currents are fed to the POS TRIM node in output stage 34. Fixed trim current POS TRIM 1 is the dashed line, and adaptive trim current POS TRIM 2 is the solid line. As discussed above, POS TRIM 1 is about constant with respect to $V_{cm}$. POS TRIM 2, on the other hand, tracks $I_{MN1}$ as it changes with $V_{cm}$. This variation in POS TRIM 2 counters the increase in $V_{os}$ that begins in the transition region (see FIG. 8b). As seen in FIG. 8b, the two trim currents combine to reduce $V_{os}$ over the entire common-mode input voltage range, with $V_{os}$ before the transition region reduced to about −33 μv, and after the transition region reduced to about 110 μv. Thus, the present trimming system is seen to significantly reduce $V_{os}$ over the entire common-mode input voltage range of a rail-to-rail op amp.

In FIG. 8b, the trace of the adaptively trimmed $V_{os}$ is seen to vary somewhat in the transition region. This is explained as follows: as noted above, Itrim(N) is linearly dependent on the MN1/MN2 current in the transition region. The transconductance of a FET, on the other hand, is dependent on the square root of its drain current. When MP1/MP2 and MN1/MN2 are in the transition region, Gm is the sum of the transconductances of MP1/MP2 and MN1/MN2. When MP1/MP2 and MN1/MN2 are each conducting about half the full scale current, Gm is about 70% of the full scale Gm; i.e., Gm in the transition region is less than the Gm when only MP1/MP2 or MN1/MN2 are active. This results in a narrow range of common-mode voltages over which $V_{os}$ is less accurately trimmed. But as is also seen in the adaptively trimmed $V_{os}$ plot, this inaccuracy is not very significant and can typically be ignored. However, if desired, this error can be further reduced by employing a constant Gm input stage, which are well-known to those in the art of op amp design. Ideally, Itrim(N) would be made dependent on the square root of the MN1/MN2 drain current in the transition region. However, building a reliable current source that varies with the square root of a parameter is difficult, and since the error that results from the implementations described herein is likely to be tolerable, such a current source is typically not needed.

Figure 9:
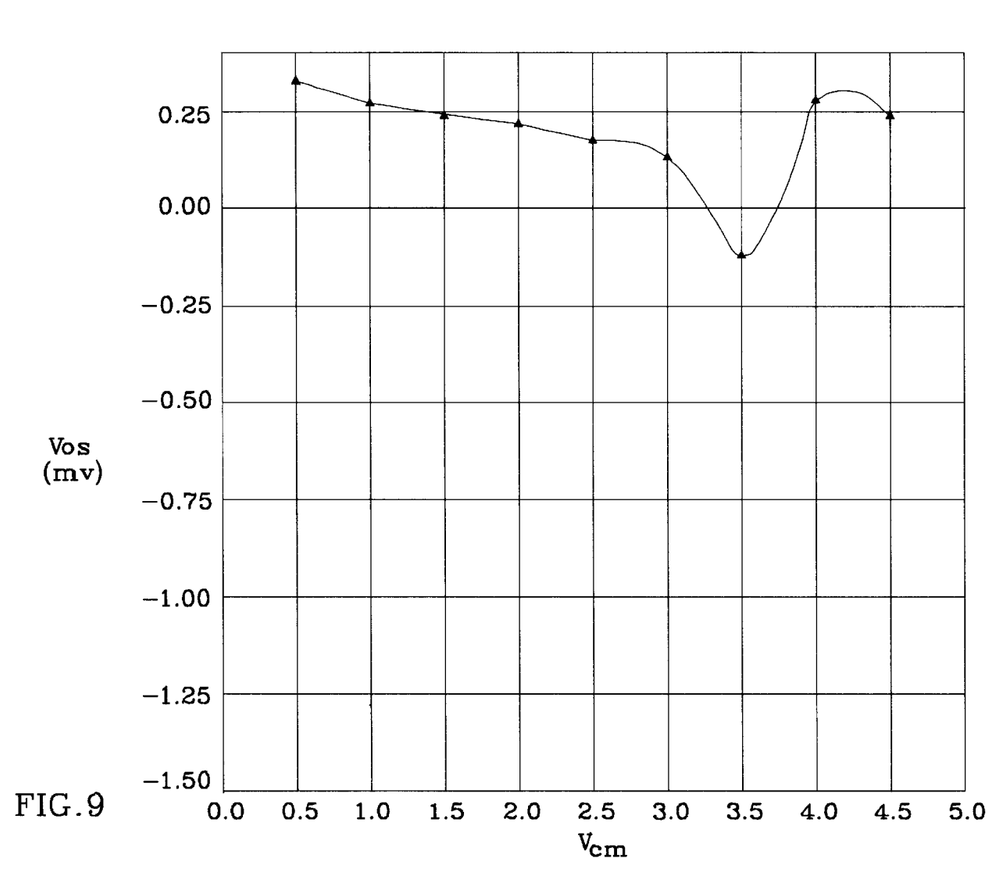
FIG. 9 is a plot of offset voltage vs. common-mode input voltage for an actual op amp per the present invention.

FIG. 9 is a plot of offset voltage vs. common-mode voltage for an actual op amp which utilizes adaptive trimming per the present invention. Over a $V_{cm}$ range of 0.5 to 4.5 volts, $V_{os}$ is seen to vary from a high of +0.33 μv to a low of −0.13 μv, improving on the untrimmed $V_{os}$ of FIG. 8b by a factor of 10 or more.

Figure 10:
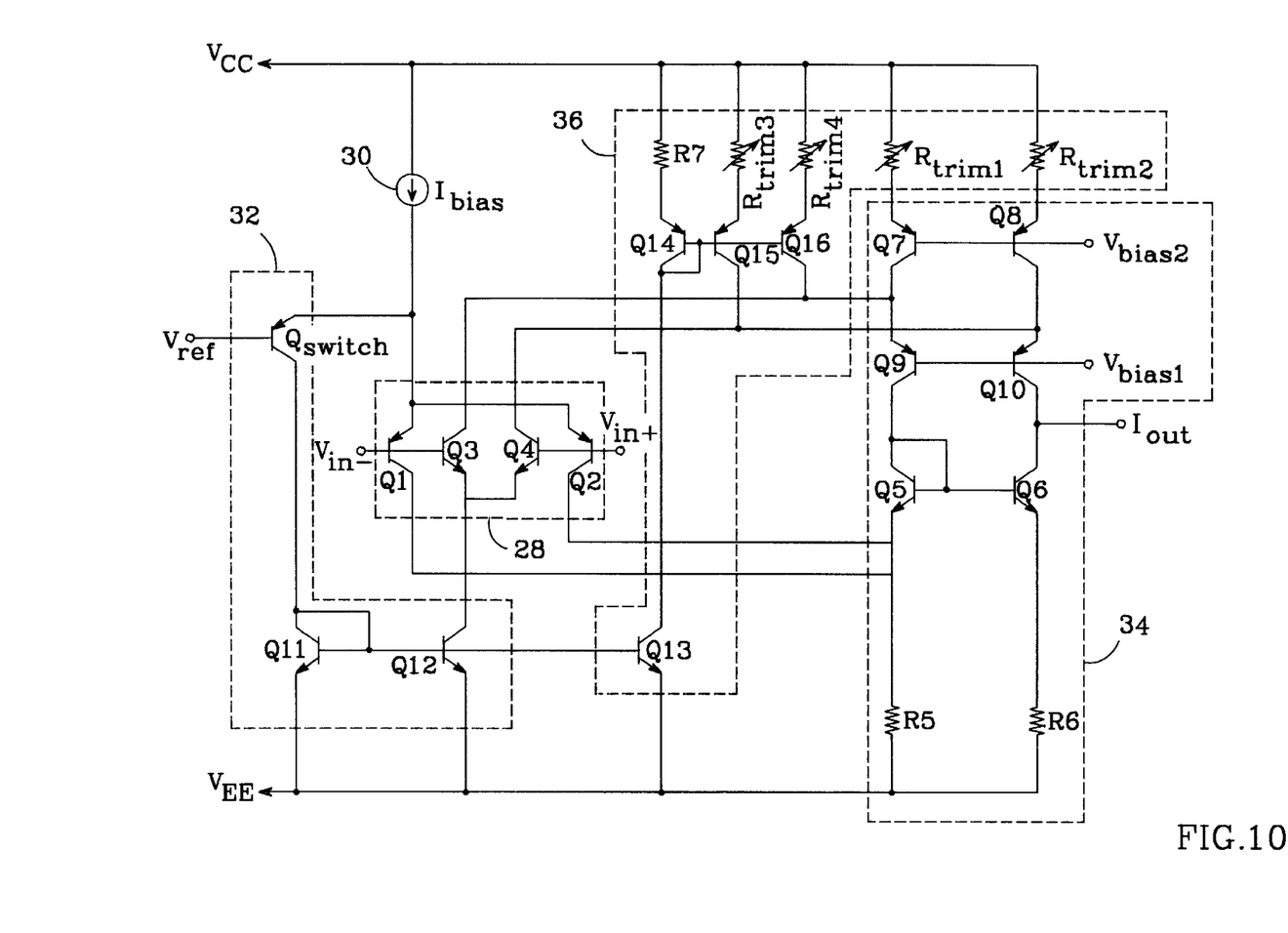
FIG. 10 is a schematic diagram of an alternative embodiment of a rail-to-rail op amp with adaptive offset voltage trimming per the present invention.

FIG. 10 is a schematic diagram of an alternative, all bipolar transistor implementation of a rail-to-rail op amp with adaptive trimming, which is largely similar to the FET implementation shown in FIG. 4. Here, PNP transistors Q1 and Q2 and NPN transistors Q3 and Q4 comprise complementary differential pair 28. Output stage 34 includes transistors Q5–Q10 and resistors R5 and R6, and current sense/switching circuitry 32 includes transistors Q11, Q12 and $Q_{switch}$. Trim circuit 36 is made from transistors Q14–Q16 and resistors R7 and $R_{trim1}$–$R_{trim4}$.

The trim elements are realized with resistors $R_{trim1}$–$R_{trim4}$. $R_{trim1}$ and $R_{trim2}$ are used to provide a fixed trim of the currents in output stage transistors Q7 and Q8; these currents serve to trim the op amp's offset voltage when the PNP input differential pair Q1 and Q2 are active. When the NPN differential pair Q3 and Q4 are active, the currents in Q13–Q16 dynamically track the current in Q3 and Q4. $R_{trim3}$ and $R_{trim4}$ are used to adjust the currents in Q15 and Q16; these currents serve to adaptively trim the offset voltage when Q3 and Q4 are active. $R_{trim1}$–$R_{trim4}$ may be, for example, thin-film resistors that are laser-trimmed as needed.

While particular embodiments of the invention have been shown and described, numerous variations and alternate embodiments will occur to those skilled in the art. Accordingly, it is intended that the invention be limited only in terms of the appended claims.

I claim:

1. An adaptive operational amplifier offset voltage trimming system, comprising:
   an operational amplifier comprising:
      an input stage comprising complementary differential pairs connected to receive a differential input and biased to produce respective differential output currents in response,
      an output stage arranged to receive said differential output currents and to produce an output in response, said output stage including at least one trim input and arranged to vary said output in response to one or more trim signals applied to said at least one trim input,
      a switching circuit connected to said complementary differential pairs and arranged to activate one or the other of said pairs depending on the common-mode input voltage presented at said differential input, and
   trim circuitry arranged to track the current conducted by at least one of said complementary differential pairs and to provide an adaptive trim signal which varies with said tracked current to said at least one trim input to reduce said operational amplifier's input offset voltage,
   wherein said operational amplifier is powered by first and second supply voltages and has a common-mode input range which includes said first and said second supply voltages, said adaptive trim signal enabling said amplifier's input offset voltage to be reduced over its entire common mode input range.

2. The system of claim 1, wherein said trim circuitry comprises first and second trim current-generating circuits, said first trim current-generating circuit arranged to provide a trim signal to said at least one trim input which is about constant over said common-mode input range and said second trim current-generating circuit providing said adaptive trim signal to said at least one trim input.

3. The system of claim 1, wherein said trim circuitry comprises first and second trim current-generating circuits, said first trim current-generating circuit arranged to track the current in one of said complementary differential pairs and to provide a first trim signal to said at least one trim input which varies with said first tracked current and said second trim current-generating circuit arranged to track the current in the other of said complementary differential pairs and to provide a second trim signal to said at least one trim input which varies with said second tracked current, both of said first and second trim signals being adaptive trim signals.

4. An adaptive operational amplifier offset voltage trimming system, comprising:
  an operational amplifier powered by first and second supply voltages and having a common-mode input range which includes said first and said second supply voltages, said amplifier including:
    a first differential pair connected to receive a differential input and to produce a first differential current in response, said first pair arranged to conduct for common-mode voltages that are in a first portion of said common-mode input range,
    a second differential pair complementary to said first pair and connected to receive said differential input and to produce a second differential current in response, said second pair arranged to conduct for common-mode voltages that are outside said first portion of said input range,
    a switching circuit coupled to said first and second differential pairs and arranged to turn off said first pair and to activate said second pair when the common-mode input voltage presented at said differential input is outside of said first portion of said input range, and
    an output stage arranged to receive said differential output currents and to produce an output in response, said output stage including at least one trim input and arranged to vary said output in response one or more trim signals applied to said at least one trim input, and
  trim circuitry, comprising:
    a first trim circuit arranged to provide a first trim signal to said at least one trim input which is about constant over said common-mode input range, and
    a second trim circuit arranged to track the current in said second pair and to provide an adaptive trim signal which varies with said tracked current to said at least one trim input to reduce said operational amplifier's input offset voltage over its entire common mode input range.

5. The system of claim 4, wherein both of said first and second differential pairs are partially conducting for common-mode voltages within a transition range, said adaptive trim signal becoming active within said transition range and thereby reducing the input offset voltage of said amplifier in said transition range.

6. The system of claim 4, wherein said adaptive trim signal is proportional to the current conducted by said second differential pair.

7. The system of claim 4, wherein said first trim circuit comprises a plurality of selectable current sources which produce respective fixed currents and a summing circuit, the currents from selected current sources summed by said summing circuit to produce said first trim signal.

8. The system of claim 7, wherein said first trim circuit further comprises a plurality of switch transistors which select respective current sources in accordance with control voltages applied to said switch transistors' respective control inputs.

9. The system of claim 8, wherein said control voltages which produce a desired first trim signal are permanently encoded.

10. The system of claim 4, wherein said second trim circuit comprises a summing circuit and a plurality of selectable current sources which produce respective currents that vary with said tracked current, the currents from selected current sources summed by said summing circuit to produce said adaptive trim signal.

11. The system of claim 10, wherein said second trim circuit further comprises a plurality of switch transistors which select respective current sources in accordance with control voltages applied to said switch transistors' respective control inputs, said control voltages determining which of said current sources are summed to produce said adaptive trim signal and thereby establish a maximum adaptive trim signal.

12. The system of claim 11, wherein said control voltages which produce a desired maximum adaptive first trim signal are permanently encoded.

13. The system of claim 4, wherein said switching circuit comprises a first transistor which receives a reference voltage at its control input and having a current circuit coupled between the current circuits of said first pair and a current mirror coupled to the current circuits of said second pair, said first transistor conducting when the voltage at said first node exceeds said reference voltage by a predetermined amount, said current conducted by said first transistor mirrored to said second pair by said current mirror to activate said second pair, said reference voltage establishing the common-mode input voltage at which said switching circuit turns off said first pair and activates said second pair.

14. The system of claim 13, further comprising a second transistor which receives said reference voltage at its control input and having a current circuit coupled between the current circuits of said first pair and said second trim circuit, said second transistor conducting when the voltage at said first node exceeds said reference voltage by a predetermined amount, said current conducted by said second transistor coupled to said second trim circuit to enable said second trim circuit to track the current in said second pair.

15. The system of claim 4, wherein said output stage comprises a plurality of transistors in a folded cascode configuration and having two of said trim inputs, said output stage arranged such that a positive current applied to one of said trim inputs increases said output and a positive current applied to the other of said trim inputs decreases said output.

16. The system of claim 15, wherein each of said first and second trim circuits is arranged to selectably direct its respective trim signals to either of said output stage's two trim inputs as needed to reduce said amplifier's input offset voltage.

* * * * *